(12) United States Patent
Lee et al.

(10) Patent No.: US 7,327,430 B2
(45) Date of Patent: Feb. 5, 2008

(54) LIQUID CRYSTAL DISPLAY MODULE AND AN ASSEMBLY METHOD THEREFOR

(75) Inventors: Sang-Duk Lee, Yongin (KR); Min-Ho Ok, Suwon (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 10/608,008

(22) Filed: Jun. 30, 2003

(65) Prior Publication Data

US 2004/0090567 A1    May 13, 2004

Related U.S. Application Data

(63) Continuation of application No. 09/382,820, filed on Aug. 25, 1999, now Pat. No. 6,587,166.

(30) Foreign Application Priority Data

Aug. 26, 1998    (KR) .................................. 98-034585

(51) Int. Cl.
  *G02F 1/1345*    (2006.01)
  *G02F 1/1333*    (2006.01)
(52) U.S. Cl. ........................................ 349/150; 349/58
(58) Field of Classification Search ............ 349/58–61, 349/149–152
  See application file for complete search history.

(56) References Cited

U.S. PATENT DOCUMENTS

| 5,216,411 A | | 6/1993 | Ashitomi et al. | ............. 349/58 |
|---|---|---|---|---|
| 5,442,470 A | * | 8/1995 | Hashimoto | .................... 349/58 |
| 5,479,285 A | | 12/1995 | Burke | ........................... 349/58 |
| 5,504,605 A | | 4/1996 | Sakuma et al. | ................ 349/58 |
| 5,838,400 A | | 11/1998 | Ueda et al. | .................... 349/58 |
| 5,988,827 A | * | 11/1999 | Lee | .............................. 362/633 |
| 6,411,353 B1 | * | 6/2002 | Yarita et al. | ................... 349/59 |
| 6,583,843 B2 | * | 6/2003 | Ishino | ......................... 349/149 |
| 6,587,166 B1 | * | 7/2003 | Lee et al. | ...................... 349/58 |
| 6,862,053 B2 | * | 3/2005 | Lee et al. | ...................... 349/58 |

* cited by examiner

*Primary Examiner*—Dung T. Nguyen
(74) *Attorney, Agent, or Firm*—Don C. Lawrence; MacPherson Kwok Chen & Heid LLP

(57) ABSTRACT

A display module of an LCD device having a rear case shaped as a four-cornered container having sidewalls on each of its four edges; a backlight assembly formed by depositing and fixing a reflector plate, a light guide plate, and a series of sheets onto a mold frame where a lamp assembly receiving portion, a gate PCB receiving portion, and a source PCB receiving portion are integrally formed; an LCD panel module having an upper panel, a lower panel coupled to the upper panel with a liquid crystal inserted therebetween, a gate PCB electrically connected to an end portion of the lower panel, and a source PCB electrically connected to another end portion of the lower panel and has a conductive pattern for an electric signal to be applied to an inverter; a main chassis which defines an active screen area of the LCD panel module and couples the mold frame and the LCD panel module to the rear case; and a front case coupled to the main chassis and covering a whole surface of the LCD panel module excluding the active screen area.

7 Claims, 16 Drawing Sheets

LIQUID CRYSTAL DISPLAY MODULE AND AN ASSEMBLY METHOD THEREFOR

CROSS REFERENCE TO RELATED APPLICATION

This application is a continuation application of U.S. application Ser. No. 09/382,820, filed on Aug. 25, 1999 which has now become U.S. Pat. No. 6,587,166.

BACKGROUND OF THE INVENTION

1. Field of the Invention

The present invention relates to a liquid crystal display (LCD) module, and more particularly, to a slimmer display module and a method for assembling the same.

2. Description of the Related Art

Recently, notebook computers having LCDs as display devices are gaining in popularity. Such notebook computers are small in size and thus easy to carry. Notebook computers are operated by internal batteries, and can be used for a certain period of time without additional power.

Notebook computers are designed to have a peripheral equipment, for example, a CD-ROM, a modem, a speaker, and so on, like a common desktop computer. The screen of the notebook computer becomes larger as LCD manufacturing techniques develop. Recently, an LCD panel of 13 inch diagonal size is being used for a notebook computer.

As the screen size increases, an overall size of the notebook computer increases, too. Accordingly, notebook computers weigh more, hindering the carriability. A common notebook computer has a thickness of 40 mm, and a weight of 2 to 3 Kg. The larger screen may increase the weight.

A display module with an LCD panel weighs from 500 g to 700 g, which is a significant portion for an overall weight.

According to the conventional method, a backlight assembly is mounted to a rear case, and an LCD panel, a source and a gate PCBs are attached to a front case via an epoxy or a double-sided tape and are assembled into the rear case.

Here, the source and gate PCBs are electrically connected using a connector member like a flexible printed circuit (FPC) which is also used for applying an electric signal to an inverter.

Accordingly, an overall structure of the display module becomes complicated, and the assembly process also becomes complicated due to various connecting members.

In addition, a reliability against a shock or a vibration for the finished product is degraded.

SUMMARY OF THE INVENTION

It is therefore an object of the present invention to achieve a slimmed display module by simplifying the structure of the display module.

It is another object of the present invention to assemble a display module more efficiently.

According to an aspect of the present invention, there is provided a display module including a rear case shaped as a four-cornered container having sidewalls at each of four edges, a backlight assembly formed by depositing and fixing a reflector plate, a light guide plate, and a series of sheets onto a mold frame that integrally has a lamp assembly receiving portion, a gate PCB receiving portion, and a source PCB receiving portion, an LCD panel module having an upper panel, a lower panel coupled to the upper panel with a liquid crystal layer inserted therebetween, a gate PCB electrically connected to an end portion of the lower panel, and a source PCB electrically connected to another end portion of the lower panel and having a conductive pattern for an electric signal to be applied to an inverter, a main chassis that defines an active screen area of the LCD panel module and couples the mold frame and the LCD panel module to the rear case, and a front case coupled to the main chassis and covering the whole surface of the LCD panel module except for the active screen area.

According to the present invention, the source and gate PCBs of the LCD panel module are directly and electrically connected by a board-to-board method. A first connector that connects the gate PCB and the source PCB is formed on the gate PCB, while a second connector that connects the gate PCB and the source PCB is formed on the source PCB. The first and second connectors are coupled in such a manner that the second connector is located under the first connector.

According to the present invention, the source PCB and the inverter are directly and electrically connected by a board-to-board method. The inverter has at one of its end portion a first connector that connects the source PCB and the inverter, and the source PCB has at one of its end portion a second connector that connects the source PCB and the inverter. The first and second connectors are coupled in such a manner that the second connector is located under the first connector.

According to the present invention, the source PCB is electrically connected to the lower panel through an FPC, which has a driving IC mounted onto its rear surface. The gate PCB is electrically connected to the lower panel through an FPC, which has a driving IC mounted on its front surface.

In addition, a coupling hole for grounding as well as fixing the source PCB to the rear surface of the mold frame is formed on the source PCB.

According to another aspect of the present invention, there is provided a display module including a rear case shaped as a four-cornered container having sidewalls on each of four edges, a backlight assembly formed by depositing and fixing a reflector plate, a light guide plate, and a series of sheets onto a mold frame that integrally has a lamp assembly receiving portion, an inverter supporting bar, a gate PCB receiving portion and a source PCB receiving portion at its right, left, upper and left edges, an LCD panel module having an upper panel, a lower panel coupled to the upper panel with a liquid crystal layer inserted therebetween, a gate PCB electrically connected to an end portion of the lower panel, and a source PCB electrically connected to another end portion of the lower panel which is adjacent to the one end portion of the lower panel, a main chassis that defines an active screen area of the LCD panel module and couples the mold frame and the LCD panel module to the rear case, and a front case coupled to the main chassis and covering the whole surface of the LCD panel module except for the active screen area.

According to the present invention, a protrusion is formed on the upper surface of the inverter supporting bar, and an aperture for the insertion of the protrusion is formed in the corresponding position of the inverter. Preferably, a guide groove is formed in widthwise direction in the inverter corresponding to the inverter supporting bar.

According to the present invention, the inverter is supported by the inverter supporting bar, so that components mounted to the inverter can face the rear case.

The gate PCB receiving portion of the mold frame has a plurality of windows for accommodating components mounted to the gate PCB and are surrounded by sidewalls and separated by separating walls.

In addition, the FPC that electrically connects the lower panel and the source PCB is bent by 180 degree so that the source PCB is fixed onto the rear surface of the mold frame. Preferably, a driving IC insertion groove for accommodating the driving IC mounted to the FPC is formed on the lower edge of the rear surface of the mold frame.

In addition, the mold frame has a supporting plate, and the portion corresponding to the source PCB is removed from the supporting plate.

According to still another aspect of the present invention, there is provided a display module including, a rear case shaped as a four-cornered container having sidewalls at each of four edges, a backlight assembly formed by depositing and fixing a reflector plate, a light guide plate, and a series of sheets onto a mold frame that integrally has a lamp assembly receiving portion, an inverter supporting bar, a gate PCB receiving portion and a source PCB receiving portion, an LCD panel module having an upper panel, a lower panel coupled to the upper panel using a liquid crystal layer inserted therebetween, a gate PCB electrically connected to an end portion of the lower panel, and a source PCB electrically connected to another end portion of the lower panel and having a conductive pattern for an electrical signal to be applied to an inverter; a main chassis that defines an active screen area of the LCD panel module and couples the mold frame and the LCD panel module to the rear case; and a front case to be coupled to the main chassis and which covers the whole surface of the LCD panel module excluding the active screen area.

Hinge receiving portions are formed in both end portions of the lower edge of the rear case, and an insulator is deposited onto the bottom surface of the rear case at the portions corresponding to the lamp assembly, the gate PCB, the source PCB and the inverter. An insulating tape, for example, can be used as an insulator.

Preferably, the rear case is made of a magnesium alloy.

A plurality of bosses for fixing the main chassis are formed onto the bottom surface of the rear case.

Preferably, guide walls are formed spaced apart from each other and toward the inner side from the upper and lower walls of the rear case at irregular intervals. The size defined by such guide walls is the same as that of the mold frame.

According to the present invention, an electrical signal is transmitted from a main body of a computer to the source PCB of the LCD panel module via the FPC that connects the source PCB and the main body of the computer. The center of FPC in the lengthwise direction that connects the source PCB and main body of the computer is attached to an FPC holder one end of which is to be fixed to the hinge, and the both end portions of the FPC are wound rotatably several times onto the FPC holder. In addition, one end portion of the FPC is inserted into a terminal block mounted to the source PCB, and another end portion of the FPC has a connector for a connection with the main body of the computer.

According to the present invention, the main chassis is shaped as a four-cornered container, four edges of which have respective sidewalls, and has a plurality of coupling holes for coupling to the bosses that are formed integrally with the rear case.

The main chassis has at its center a window for an active screen area. The main chassis is sized to leave a certain space between sidewalls of the main chassis and the rear case, when the main chassis is fixed to the rear case.

At least one of the coupling holes formed at the main chassis is connected to the boss of the rear case via a tab of the mold frame. Preferably, the main chassis is made of stainless steel.

According to the present invention, the front case are shaped as a four-cornered container of which four edges have walls respectively. The center of the front case has a window for an active screen area. In addition, the front case has at its rear surface protrusions to be inserted into the grooves formed on the walls of the main chassis, along its edge.

In addition, a hinge cover portion is formed at the front case corresponding to the hinge receiving portion of the rear case.

According to still another aspect of the present invention, there is provided a method for assembling a display module of the present invention including the steps of mounting an LCD panel to a backlight assembly that is formed by depositing a reflector plate, a light guide plate, and a series of sheets onto a mold frame, and fixing a source PCB of the LCD panel to a rear surface of the mold frame by bending the source PCB, mounting the backlight assembly to a rear case, mounting an inverter to an inverter supporting bar formed integrally with the mold frame, coupling a main chassis to the rear case so as to fix the backlight assembly and define an active screen area, and coupling the front case to the main chassis so as to cover a whole surface excluding the active screen area of the LCD panel.

According to the present invention, when the source PCB of the LCD panel is fixed to the rear surface of the mold frame, the source and gate PCBs of the LCD panel are directly and electrically connected by a board-to-board method.

In addition, the source PCB and the inverter are directly and electrically connected by a board-to-board method after the inverter is mounted to the inverter supporting bar of the mold frame.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein.

First, terms as used throughout this specification are defined as follows.

The term of a "rear case" can be also used as a "back bezel" which is referred to as a unit for covering the rear surface of the display module.

The term of a "backlight assembly" is referred to as a unit where a lamp assembly is mounted to a mold frame, and a reflector plate, a light guide plate, and a series of sheets are deposited and fixed to the mold frame.

The term of an "LCD panel module" is referred to as a unit including an LCD panel, and a source and a gate PCBs which are electrically connected to the LCD panel.

The term of an "LCD module" is referred to as a unit where the LCD panel module is mounted to the backlight assembly.

The term of a "front case" can be also used as a "front bezel" which is referred to as a unit for covering the whole surface of the display module.

Figure 1:
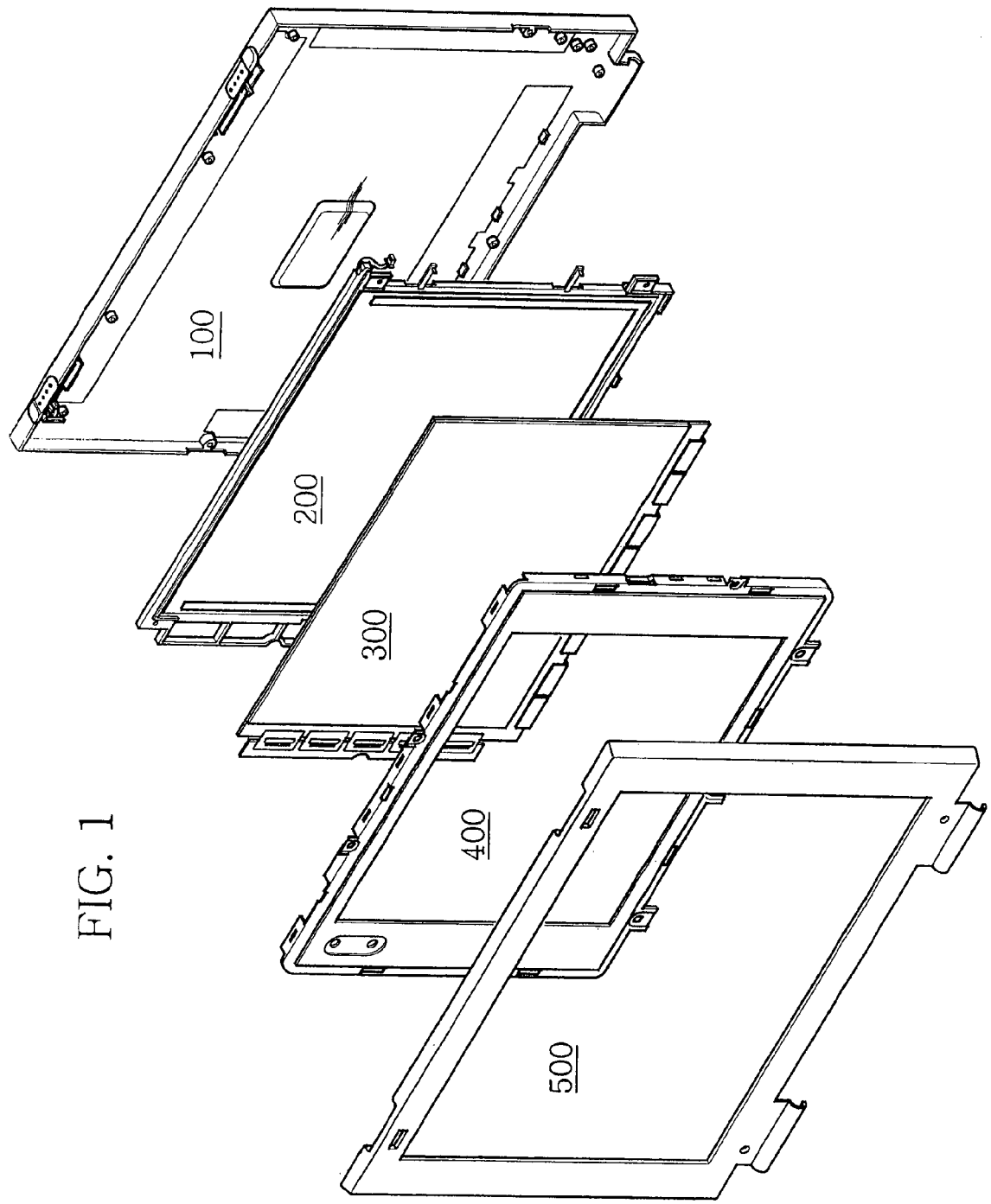
FIG. 1 is an exploded perspective view showing a display module according to the present invention.

Now referring to FIG. 1, the display module of the present invention includes a rear case 100, a mold frame 200 directly fixed attachably/detachably onto/from the rear case 100, an LCD module 300 to be accommodated into the mold frame 200, a main chassis 400 that defines an active screen area of the LCD module 300 and couples the mold frame 200 and the LCD module 300 to the rear case 100, and a front case 500 that covers the whole surface of the LCD module 300 excluding the active screen area.

Figure 2:
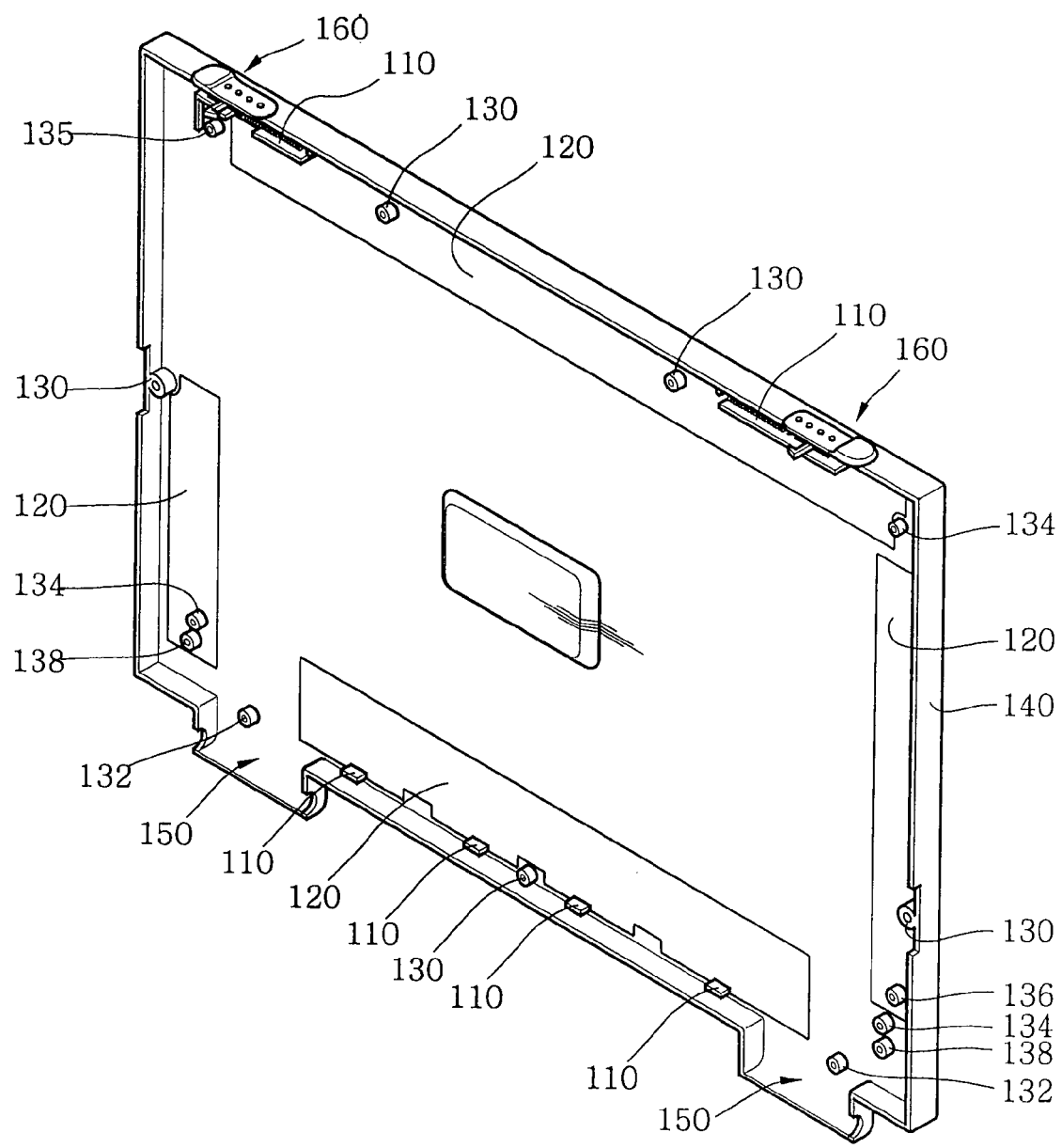
FIG. 2 is a perspective view showing a rear case according to the present invention.

Referring to FIG. 2, the rear case 100 of the present invention is shaped as a four-cornered container, and is composed of substances having a strong endurance against a shock and an excellent exothermic feature than a common resin, for example, a magnesium alloy. The rear case 100 has various bosses integrally formed by die-casting.

Sidewalls 140 are formed by extending to a predetermined height from the four edges of the rear case 100, and hinge receiving portions 150 into which hinges that will be described later are to be accommodated are formed at both ends of the lower wall 140. In addition, locking portions 160 for connecting a main body (not shown) of a computer are disposed at both ends of the upper wall 140.

A plurality of guide walls 110 are formed at regular intervals spaced apart from each other and toward the inside of the walls 140. The size defined by such guide walls 110 is the same as that of the mold frame 200, which will be discussed later. Therefore, the mold frame 200 can be easily assembled into the rear case with the help of the guide walls 110, and can be precisely fixed to the rear case 100.

A plurality of bosses 130, 132, 134, 135, 136, 138 are integrally formed on the rear case 100 along the walls 140. The boss 130 is for fixing the main chassis 400, the boss 132 is for fixing the main chassis 400 and the front case 500, the boss 134 is for fixing the mold frame 200, the boss 135 is for fixing the mold frame 200 and the main chassis 400 altogether, the boss 136 is for fixing an inverter, and the boss 138 is for fixing a hinge cover (not shown) that prevents a possible deviation of the hinge.

The rear case 100 is provided with an insulating tape 120 at portions corresponding to a lamp assembly, source/gate PCBs, and the inverter of the LCD module 300. Since the rear case 100 is composed of a magnesium alloy, which is conductive, the rear case 200 needs to be insulated from the lamp assembly, source/gate PCBs, and the inverter for electrostatic shielding. An insulating material may be applied instead of the insulating tape 120.

Figure 3:
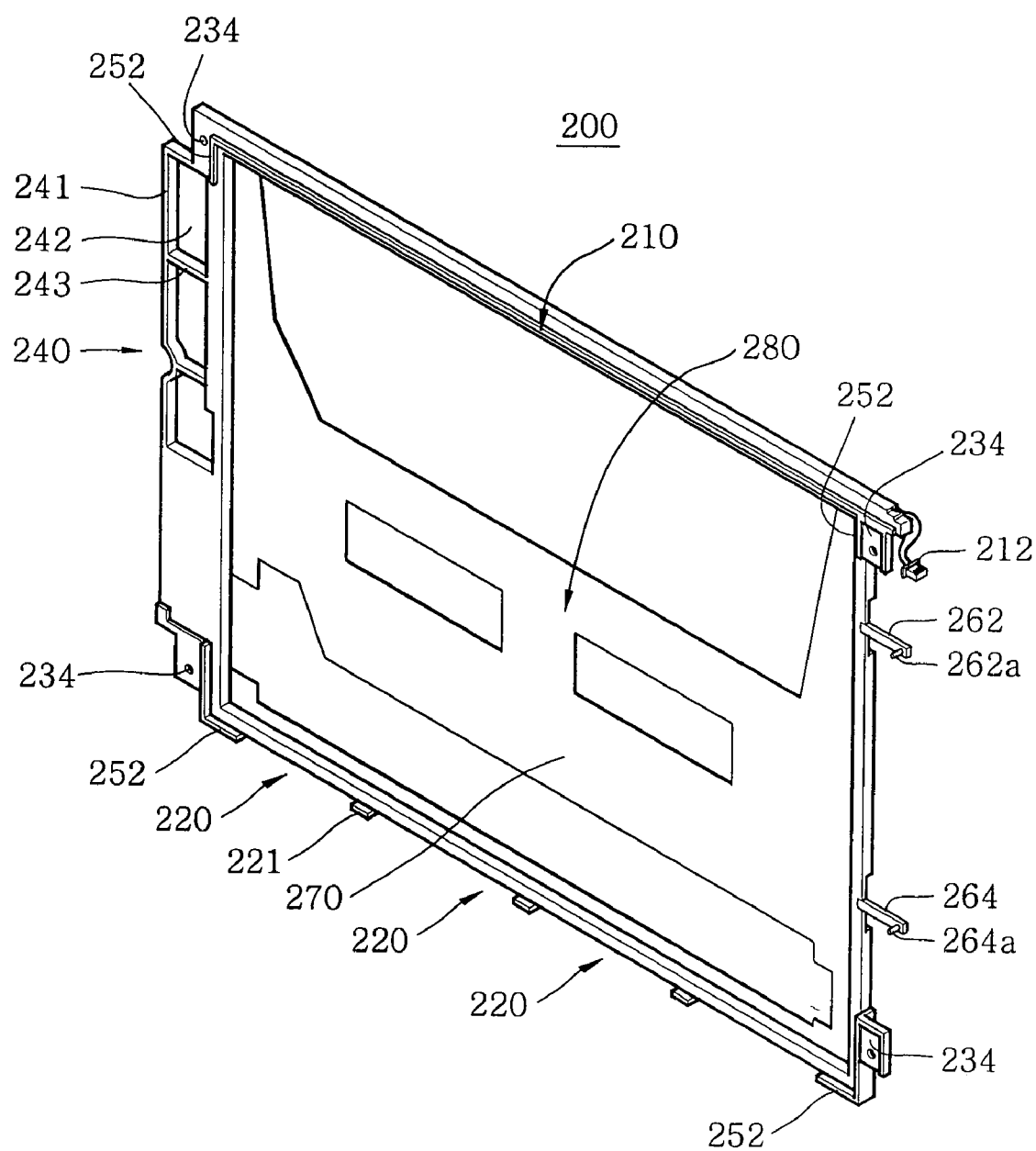
FIG. 3 is a perspective view showing a mold frame according to the present invention.

Referring to FIG. 3, the mold frame 200 has a main receiving area 280 into which a reflector plate, a light guide plate, and a series of sheets are deposited and accommodated. The main receiving area 280 has at its bottom an integrally formed supporting plate 270 to support the reflector plate and to ensure the space for accommodating the source PCB.

The main receiving area 280 has at its upper edge a lamp assembly receiving portion 210 formed integrally therewith and accommodating the lamp assembly.

Figure 3A:
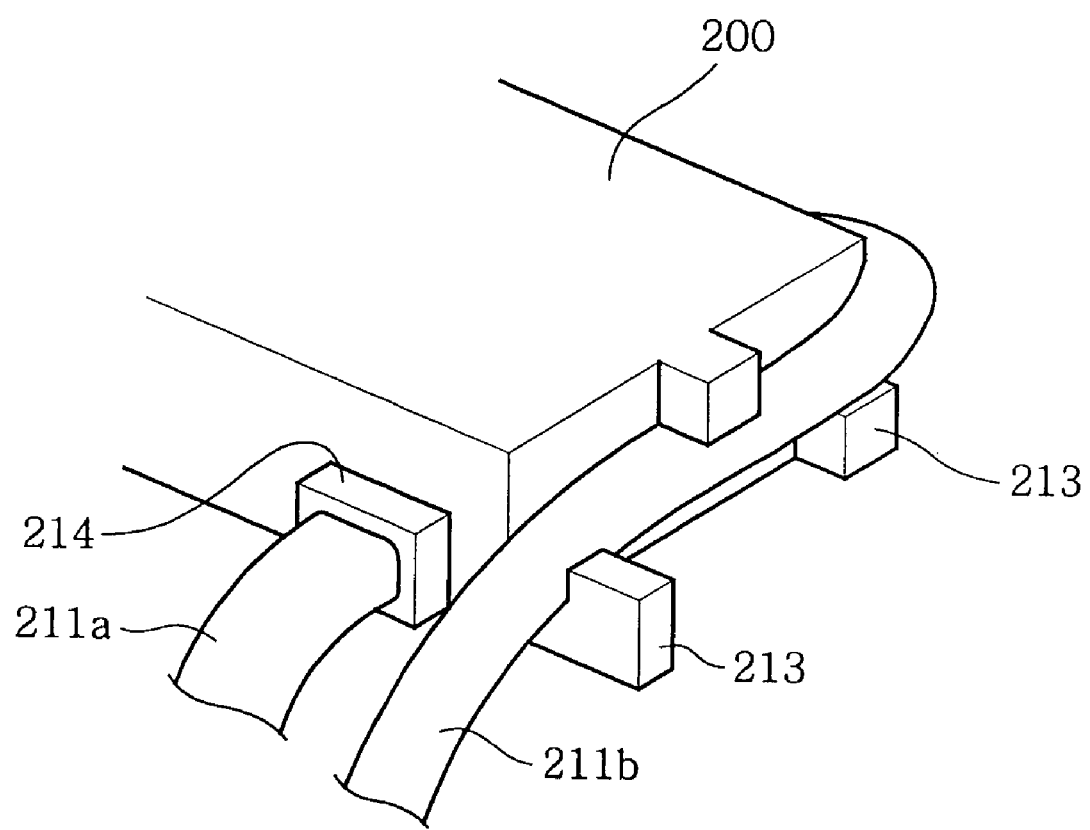
FIG. 3A is a perspective view showing a structure for fixing a lamp wire according to the present invention.

Referring to FIG. 3A, the lamp assembly receiving portion 210 has a reinforcement rib 214 for reinforcing the lamp assembly receiving portion, which is formed integrally where a lamp wire 211a escapes from the interior of the lamp assembly receiving portion 210. Fixing ribs 213 for fixing a lamp wire 211b are formed at the other end portions of the lamp assembly receiving portion 210. The reinforcement rib 214 supports the lamp wire 211a, and reinforces the fragile area of the lamp assembly receiving portion 210 caused by forming an exit for the lamp wire 211a. In addition, fixing ribs 213 are formed alternately at the opposite edges of the end portion of the lamp assembly receiving portion 210 so that the lamp wire 211b can be fixed between the fixing ribs 213.

Accordingly, lamp wires 211a, 211b come from the lamp assembly receiving portion 210 toward the inverter, which protects lamp wires 211a, 211b from the possible damage by a screw in the later assembly process. The fixing ribs 213 fix the lamp wire 211b, and thus preventing any force applied to the lamp wire 211b, from being transmitted to an electrode of the lamp.

Figure 4A:
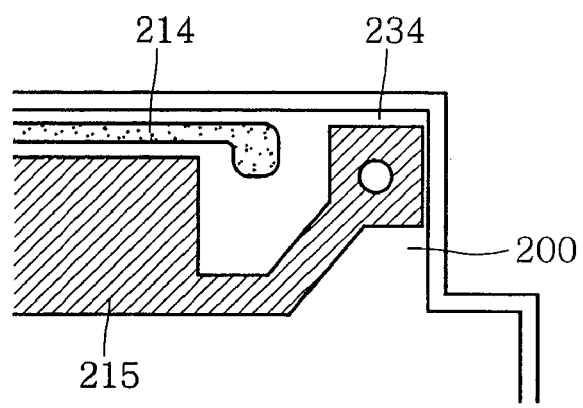
FIG. 4A is a rear elevation showing one end portion of an upper edge of a rear surface of the mold frame according to the present invention.

Referring to FIG. 4A, a lamp reflector plate 215 is exposed to the outside of the mold frame 200 and fixed onto the rear surface of the mold frame 200. In addition, wires 211a, 211b connected to both electrodes of the lamp are connected to a lamp power supply male connector 212 shown in FIG. 3 from the lamp assembly receiving portion 210.

Referring back to FIG. 3, a gate PCB receiving portion 240 is formed at the left edge of the main receiving area 280. The gate PCB receiving portion 240 is composed of a plurality of windows 242 which are surrounded by sidewalls 241 and separated by separating walls 243. A window 242 has a predetermined height by heights of walls 241, 243 so as to contain elements mounted on the gate PCB connected to the LCD panel. Source and gate PCBs are directly and electrically connected via windows 242, which will be described later.

The main receiving area 280 has a pair of inverter supporting bars 262, 264 at its right edge. In addition, inverter supporting bars 262 have insertion protrusions 262*a*, 264*a* at their end portions.

Figure 5:
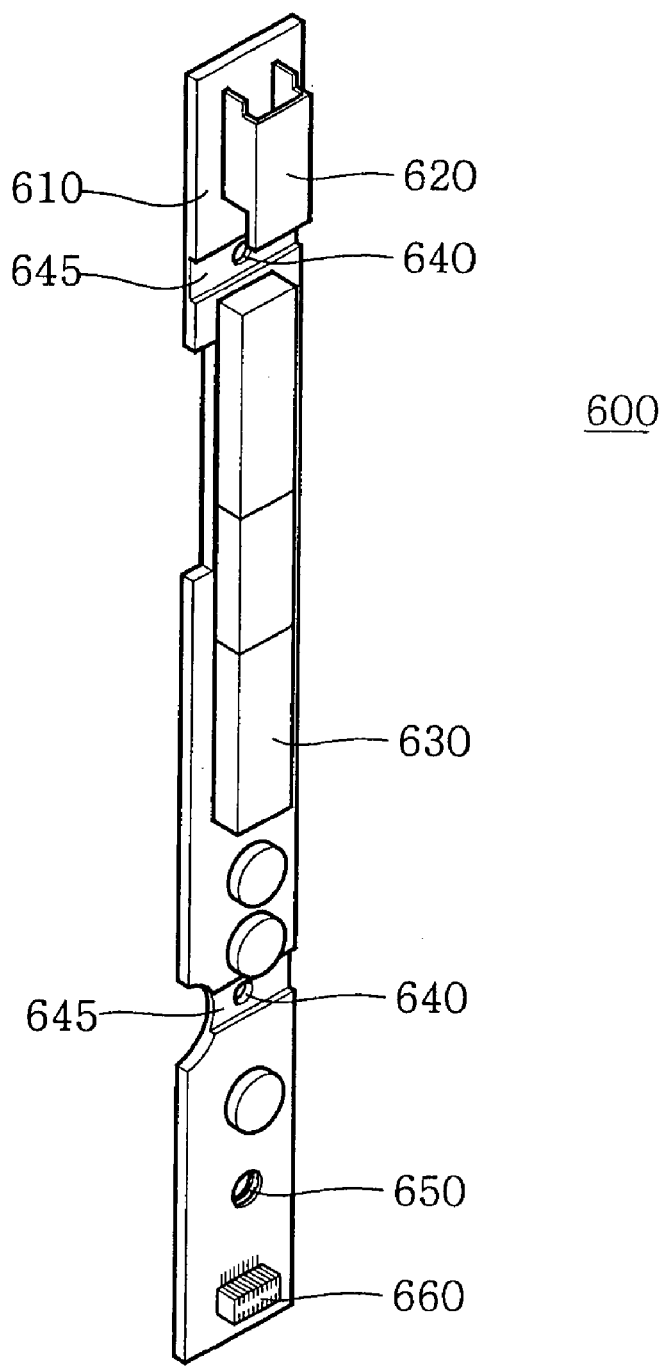
FIG. 5 is a perspective view showing an inverter to be mounted to a mold frame.

Referring to FIG. 5, an inverter PCB 610 has at one end portion thereof a lamp power supply female connector 620 to be coupled to the lamp power supply male connector 212 shown in FIG. 3, and, at another end portion thereof a male connector 660 for directly connecting the inverter to the source PCB.

Figure 13:
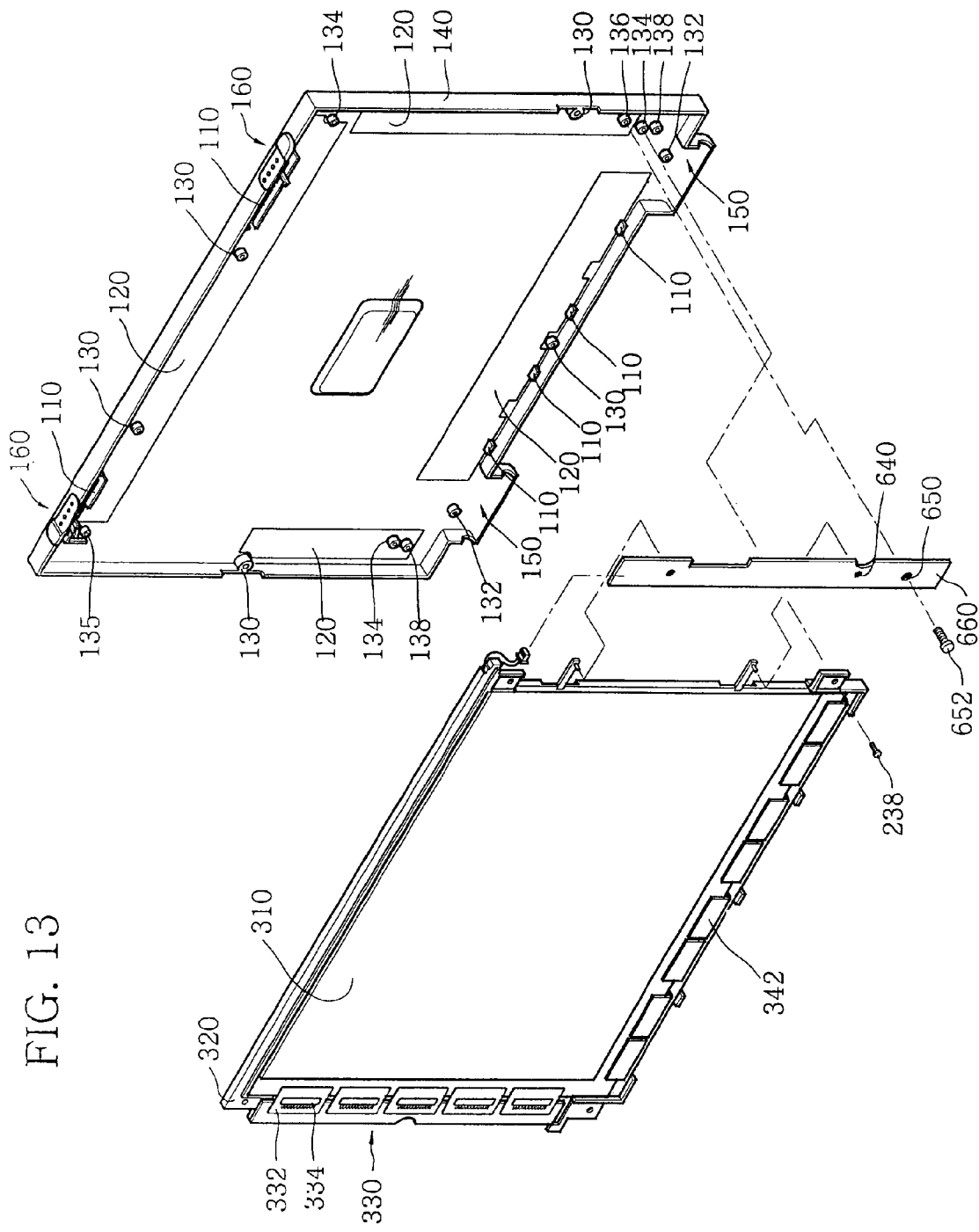
FIG. 13 is an exploded perspective view showing an LCD panel module and a rear case before they are assembled, and an inverter before it is mounted to the mold frame according to the present invention.

Insertion holes 640 for the protrusions 262*a*, 264*a* of the inverter supporting bars 262, 264 shown in FIG. 3 are formed at the corresponding portions of an inverter 600. Preferably, guide grooves 645 are formed at the portions corresponding to the inverter supporting bars 262, 264 so that the inverter supporting bars 262, 264 can be more firmly fixed. In addition, a coupling hole 650 is formed at the portion corresponding to the boss 136 on the rear case 100 as shown in FIGS. 2 and 13, so as to be coupled to the boss 136 by a screw.

Reference numeral 630 denotes elements mounted on the inverter 600.

Figure 4B:
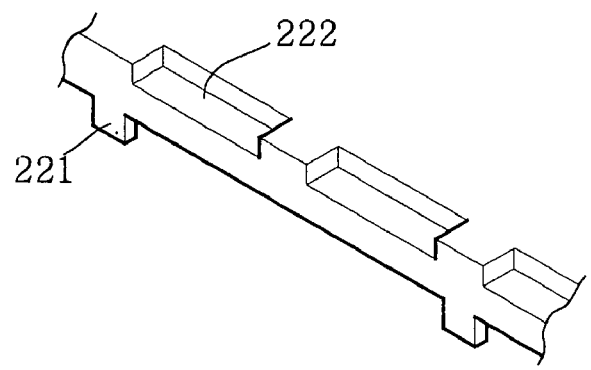
FIG. 4B is a perspective view showing a driver IC insertion groove of a lower edge of the rear surface of the mold frame according to the present invention.

As shown in FIG. 3, tape carrier package (TCP) receiving portions 220 for accommodating TCP of the source PCB that is bent and goes toward the rear surface of the mold frame 200 are formed at the bottom edge of the main receiving area 280. That is, as shown in FIG. 4B, a plurality of, say, three separating protrusions 221 are formed on the front surface of the mold frame 200, and a plurality of driver IC receiving grooves 222 are formed between the separating protrusions 221 at the rear surface of the mold frame 200.

The mold frame 200 has at its four corners tabs 234 to be coupled to bosses 130, 134, 135 of FIG. 2, and each tab 234 is provided with a ground clip (not shown).

The main receiving area 280 has at its four corners protrusions 252 for fixing the LCD panel when the LCD panel module is mounted to the mold frame 200, and which are formed to the height corresponding to the thickness of the LCD panel.

Figure 6:
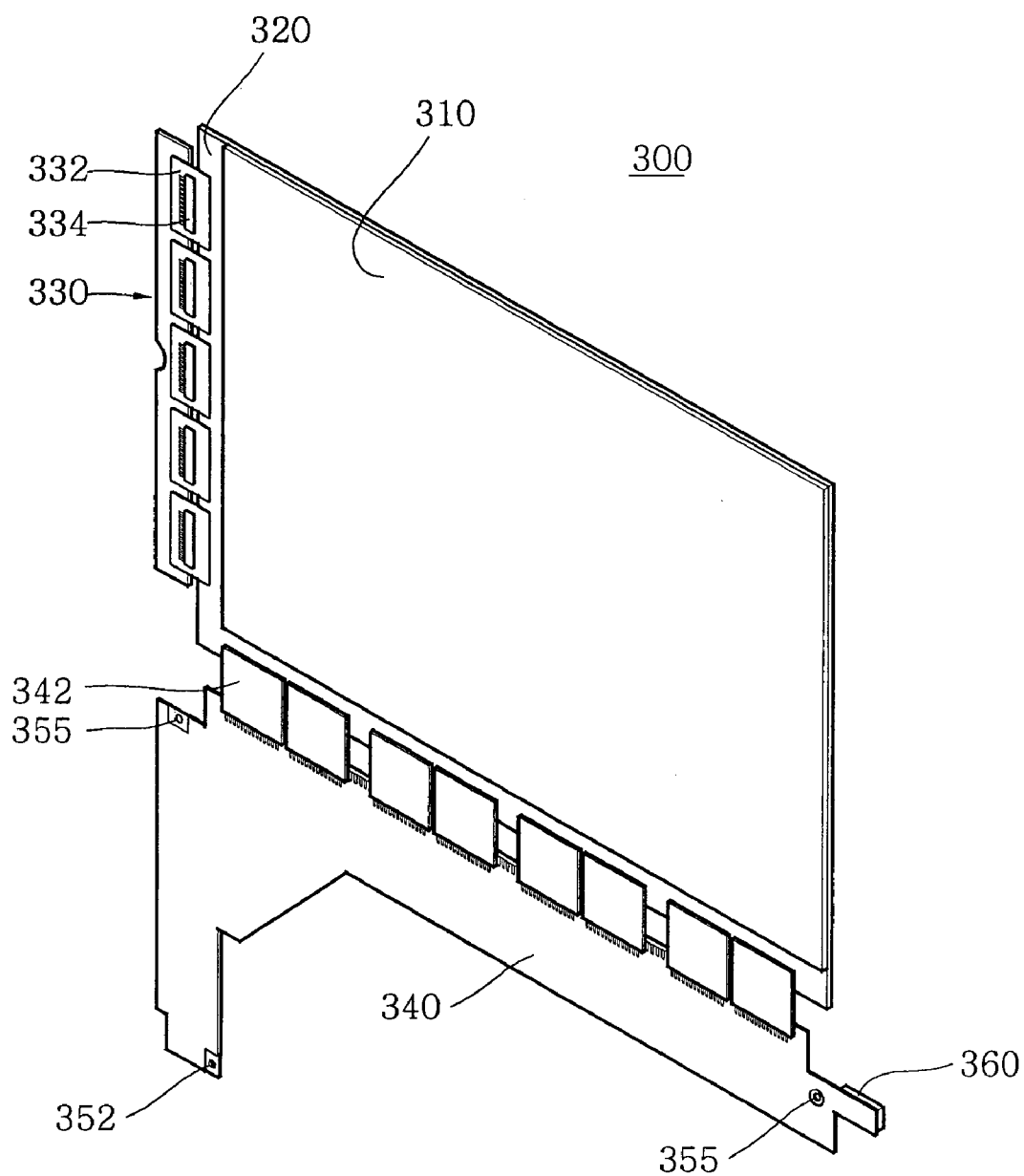
FIG. 6 is a perspective view showing a front surface of an LCD panel module according to the present invention.

Now referring to FIG. 6, the LCD panel module 300 includes an upper panel 310, a lower panel 320, a source PCB 340 connected to a connector pad for the data line in the lower panel 320, and a gate PCB 330 connected to a connector pad for the gate line in the lower panel 320.

Figure 7:
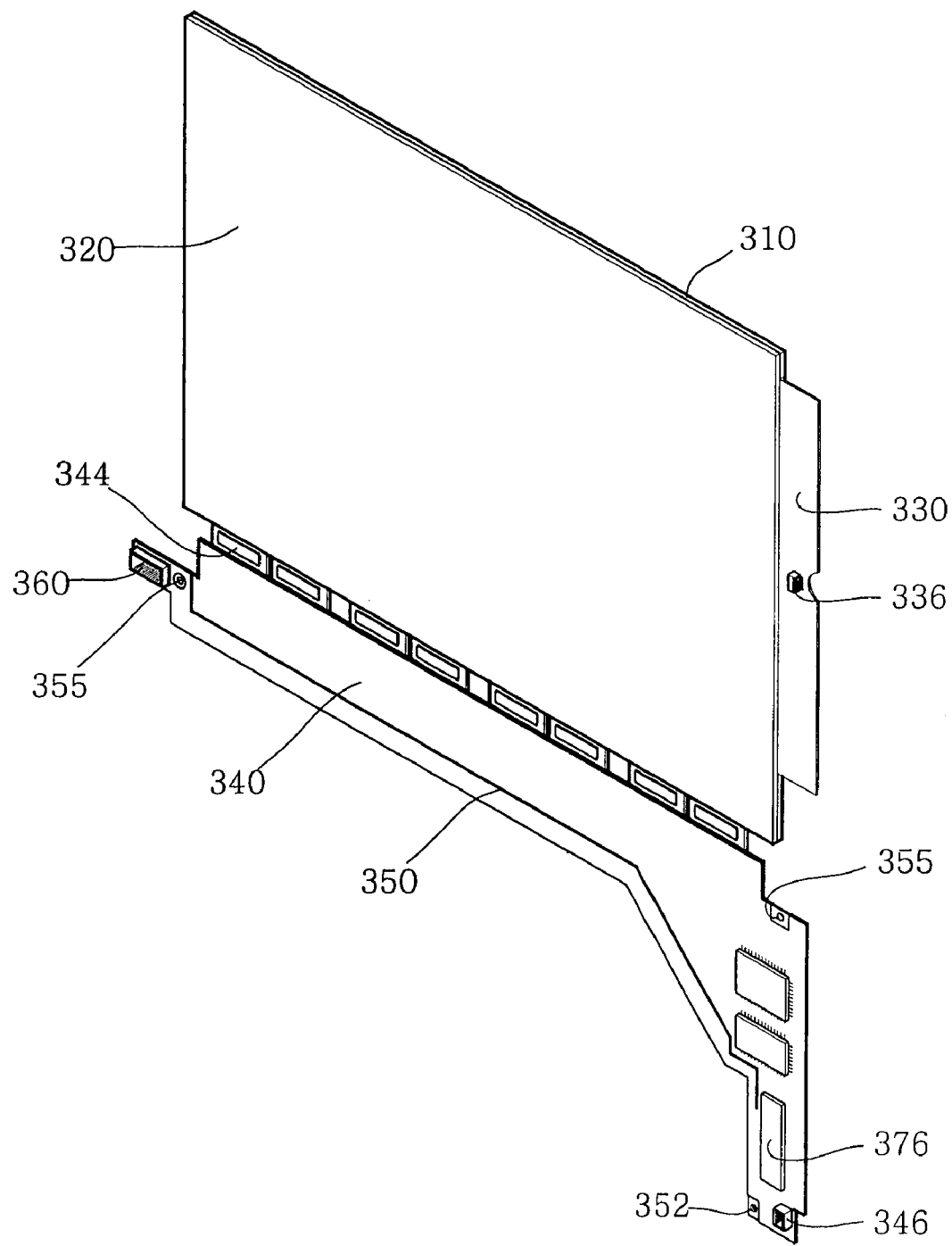
FIG. 7 is a perspective view showing a rear surface of an LCD panel module according to the present invention.

The source PCB 340 is electrically connected to the data line of the lower panel 320 via the TCP 342 for use of the source PCB 340 onto which a driver IC 344 as shown in FIG. 7 is mounted. As the pitch between the wirings of TCP is becoming more minute, a thermocompression method is widely used. The driver IC 344 is mounted to the rear surface of the TCP 342, so that the driver IC 344 is accommodated onto the rear surface of the mold frame 200 when the source PCB 340 rotates by 180 degrees and is fixed onto the rear surface of the mold frame 200. To allow the source PCB 340's 180 degree rotation, a sufficient space between the lower panel 320 and the PCB 340 is necessary.

The gate PCB 330 is electrically connected to the gate line of the lower panel 320 via the TCP 332 for the gate PCB 330 onto which a driver IC 334 is mounted. As described above, the pitch between the wirings of TCP is becoming more minute, a thermocompression method is widely used. The driver IC 334 is mounted to the front surface of the TCP 332. The gate PCB 330 needs to be tightened to the lower panel 320 for secure bondage.

According to the present invention, the gate PCB 330 and the source PCB 340 are directly and electrically connected via a connector, and the inverter 600 and the source PCB 340 are directly and electrically connected via a connector. This will be explained in more detail with reference to FIGS. 6 and 7.

Referring to FIG. 7, the gate PCB 330 has at the center of its rear surface a male connector 336 for connecting the gate PCB 330 and the source PCB 340. The source PCB 340 has at its rear surface a female connector 346 for connecting the gate PCB 330 and the source PCB 340. Male and female connectors 336, 346 are coupled by rotating the source PCB 340. Here, male and female connectors 336, 346 are coupled via the window 242 shown in FIG. 3.

In addition, a female connector 360 for connecting the source PCB and the inverter is formed at the portion of the rear surface of the source PCB 340 corresponding to the inverter 600. The female connector 360 is exposed to the front surface of the LCD panel as the source PCB 340 is rotated, and is coupled to the male connector 660 shown in FIG. 5 when the inverter 600 is fixed to the inverter supporting bars 262, 264 of the mold frame 200.

According to the present invention, the conductive pattern 350 for providing the inverter 600 with an electric signal is formed at the rear surface of the source PCB 340.

A coupling hole 355 electrically connected to the ground clip fixed to the tab 234 of the mold frame 200, which fixes the source PCB 340 onto the rear surface of the mold frame 200, is formed at both end portions of the source PCB 340 in lengthwise direction. A coupling hole 352 is formed in the vicinity of the female connector 346.

Figure 8:
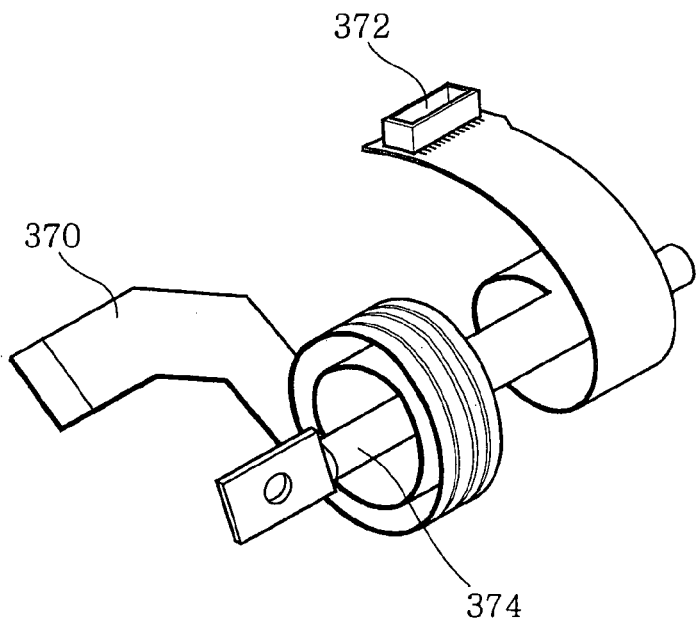
FIG. 8 is a perspective view showing a connector for connecting the LCD panel module and a main body of a computer according to the present invention.

Referring to FIG. 8, an FPC 370 is rotatably wound around an FPC holder 374, and is shaped like a step when unwound, with one end to the source PCB side and the other end to the main body of the computer. The FPC 370 has one of its end portion be inserted into a terminal block 376 of the source PCB 340 and the other end portion provided with a connector 372 be connected to an interface of the main body of the computer, for example, a notebook computer.

The FPC holder 374 is fixed to a hinge when accommodated into the hinge receiving portion 150, which will be described later. That is, a hinge 151 includes a fixing portion 155 to be fixed to the rear case 100, and an operation portion 157 coupled to the main body of the computer so as to rotate. The FPC holder 374 is screwed to the coupling groove 156.

Reference numeral 158 denotes a through hole for fixing the fixing portion 155 of the hinge 151 to the rear case 100.

Figure 9:
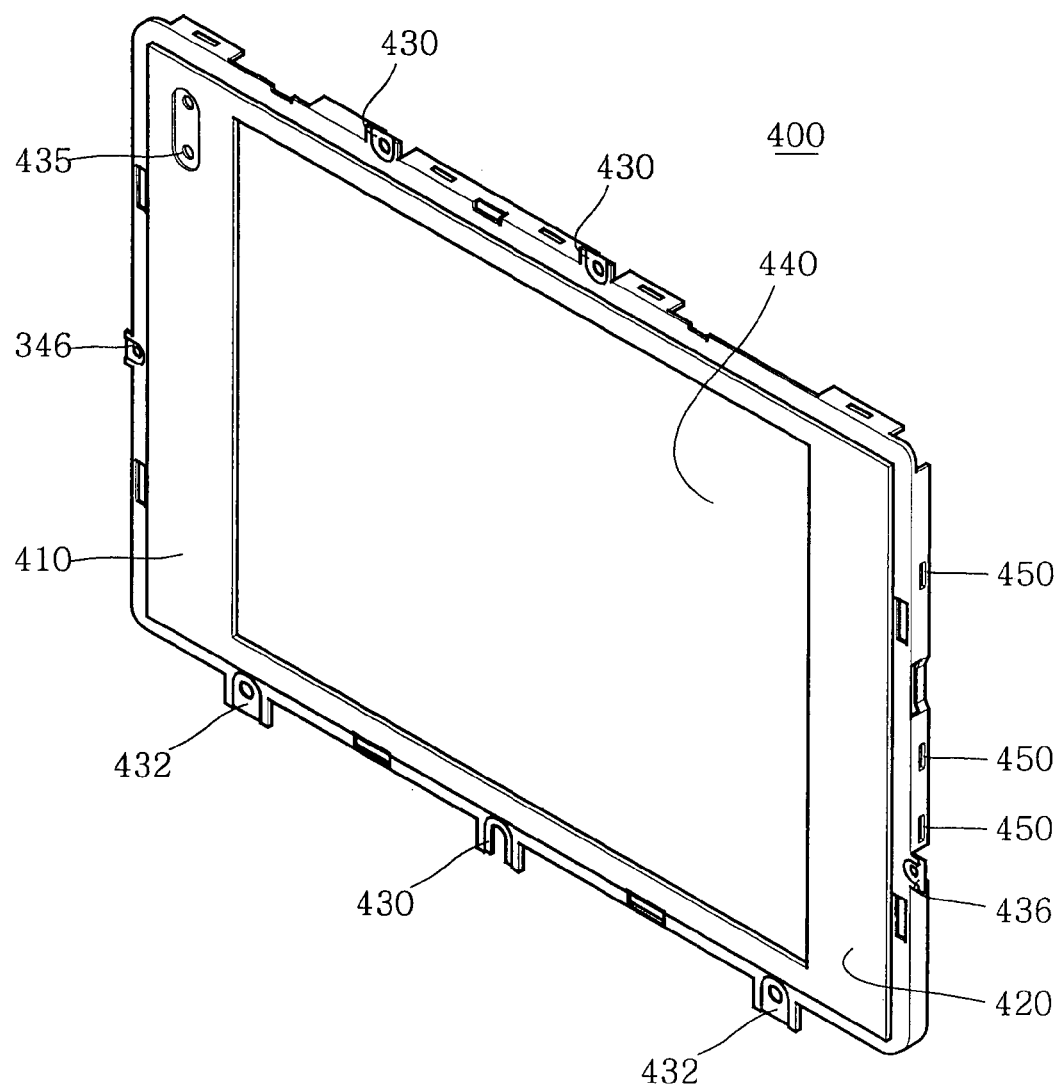
FIG. 9 is a perspective view showing a main chassis according to the present invention.

Referring to FIG. 9, the main chassis 400 has at its front surface a window 440, and is made of stainless steel. The window 440 has a size corresponding to the active screen area of the LCD panel module 300.

Sidewalls of the main chassis 400 is extended at all its four edges to the same height as that from the bottom surface of the rear case 100 up to the LCD panel module 300.

A gate PCB covering portion 410 and an inverter covering portion 420 having a predetermined width are formed respectively in the region between the left, right edges of the window 440 and the left, right edges of the main chassis 400. When the main chassis 400 covers the LCD panel module 300, which will be described later, the gate PCB covering portion 410 and the inverter covering portion 420 respectively cover the gate PCB 330 and the inverter 600.

The main chassis 400 has coupling holes 430 at its upper and bottom edges corresponding to the boss 130 of the rear case 100, to thereby fix the main chassis 400 to the rear case 100. In addition, the main chassis 400 has coupling holes 432 at its bottom edge so that the main chassis 400 can be fixed to the rear case 100. The main chassis 400 is coupled to the boss 135 of the rear case 100 together with the mold frame 200 via coupling holes 435.

However, the above-described coupling holes may have various shapes.

In addition, coupling holes 450 for coupling with the front case are formed on the sidewall of the main chassis 400.

Meanwhile, it is desirable that the main chassis 400 has a size to such an extent that a predetermined space is provided between the sidewalls of the main chassis 400 and the sidewalls of the rear case 100 when the main chassis 400 is fixed to the rear case 100.

Figure 10:
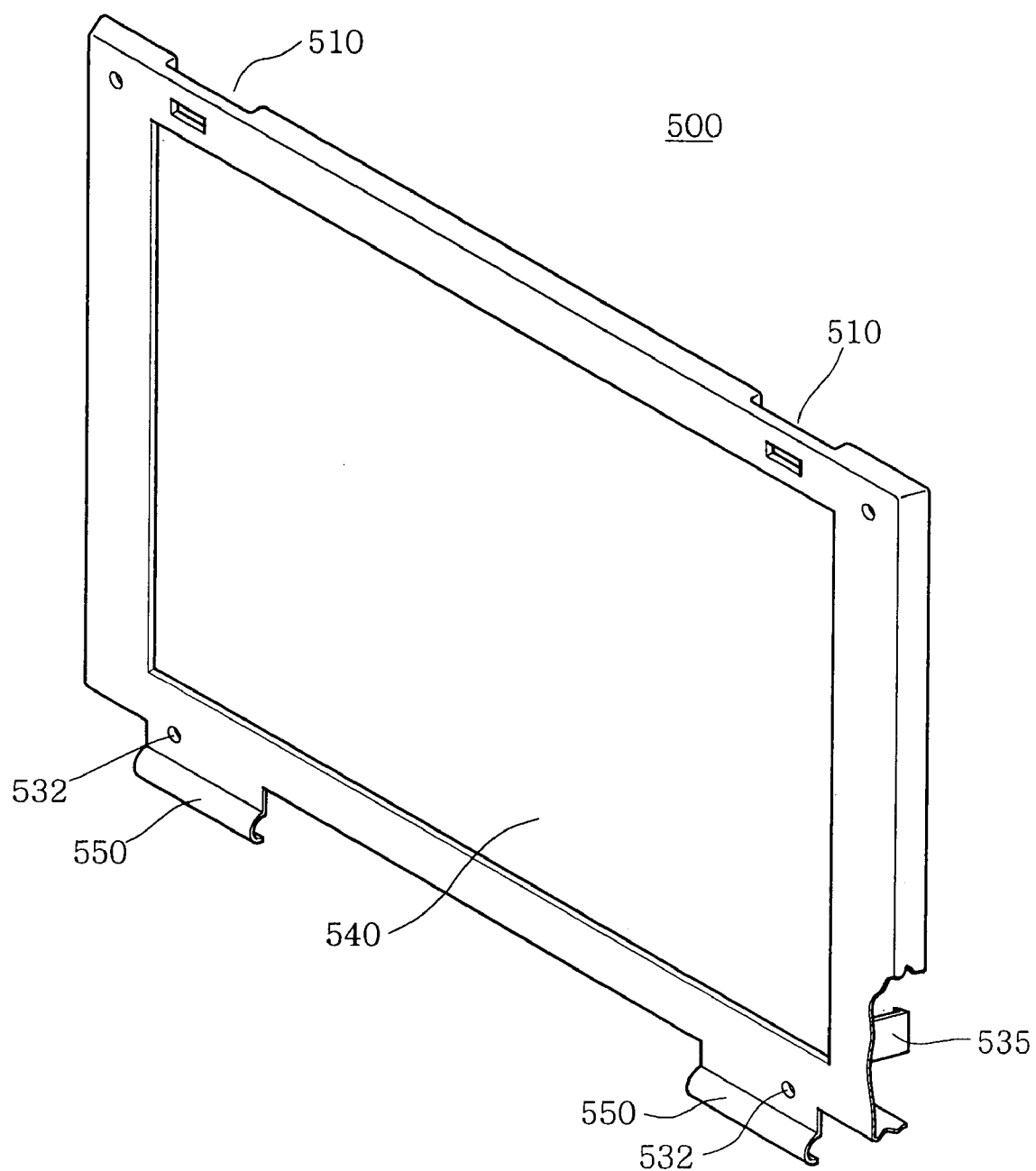
FIG. 10 is a perspective view showing a front case according to the present invention.

FIG. 10 illustrates the front case of the present invention.

Referring to FIG. 10, the front case 500 is made of a plastic, and has a size corresponding to the rear case 100. Like the main chassis 400, the front case 500 has walls extended from its four edges.

In addition, the front case 500 has a window 540 of the same size as that of the window 440, and coupling holes 532 respectively corresponding to coupling holes 432 of the main chassis 400.

The front case 500 has hinge covering portions 550 respectively at the portions corresponding to the hinge receiving portion 150 of the rear case 100, and is coupled to the hinge receiving portion 150 when accommodating the hinge 151 shown in FIG. 8A into the hinge receiving portion 150, which will be described later.

In addition, protrusions 535 are formed at the rear surface of the front case 500 along its edge, and are inserted into coupling holes 450 to be fixed to the main chassis 400.

The front case 500 has openings 510 at both end portions of the wall thereof for the locking portions 160 shown in FIG. 2.

A method for assembling a display module of the present invention will be explained hereinafter.

First, an LCD panel module is assembled to a backlight assembly, which then is fixed to a rear case. Next, an inverter is mounted, and a main chassis completely fixes the modules to the rear case. Then, a front case is coupled thereto, thereby completing an assembly.

Here, the backlight assembly refers to a unit where a lamp assembly, a reflector plate, a light guide plate, and a series of sheets are mounted to a mold frame, and can be manufactured through a separate assembly process aside from the main assembly process. For example, the backlight assembly can be prepared and delivered by a third party manufacturer, and used in the main assembly process. This significantly reduces the number of processes in the main assembly process.

Now, a method for assembling a backlight assembly will be explained with reference to FIGS. 4A and 11.

Figure 11:
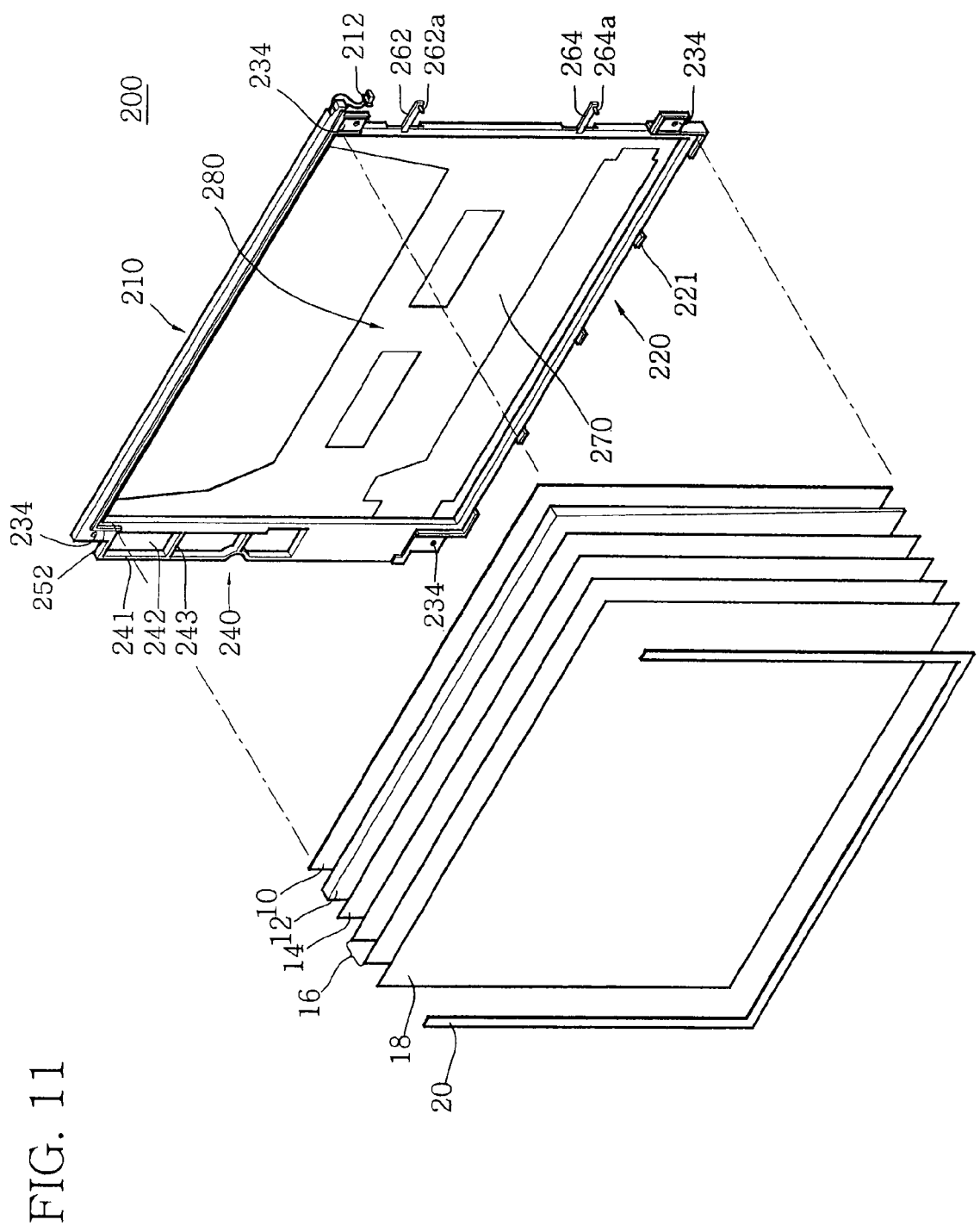
FIG. 11 is an exploded perspective view showing a mold frame, a reflector plate, a light guide plate, and a series of sheets to be assembled as a backlight assembly according to the present invention.
Figure 12:
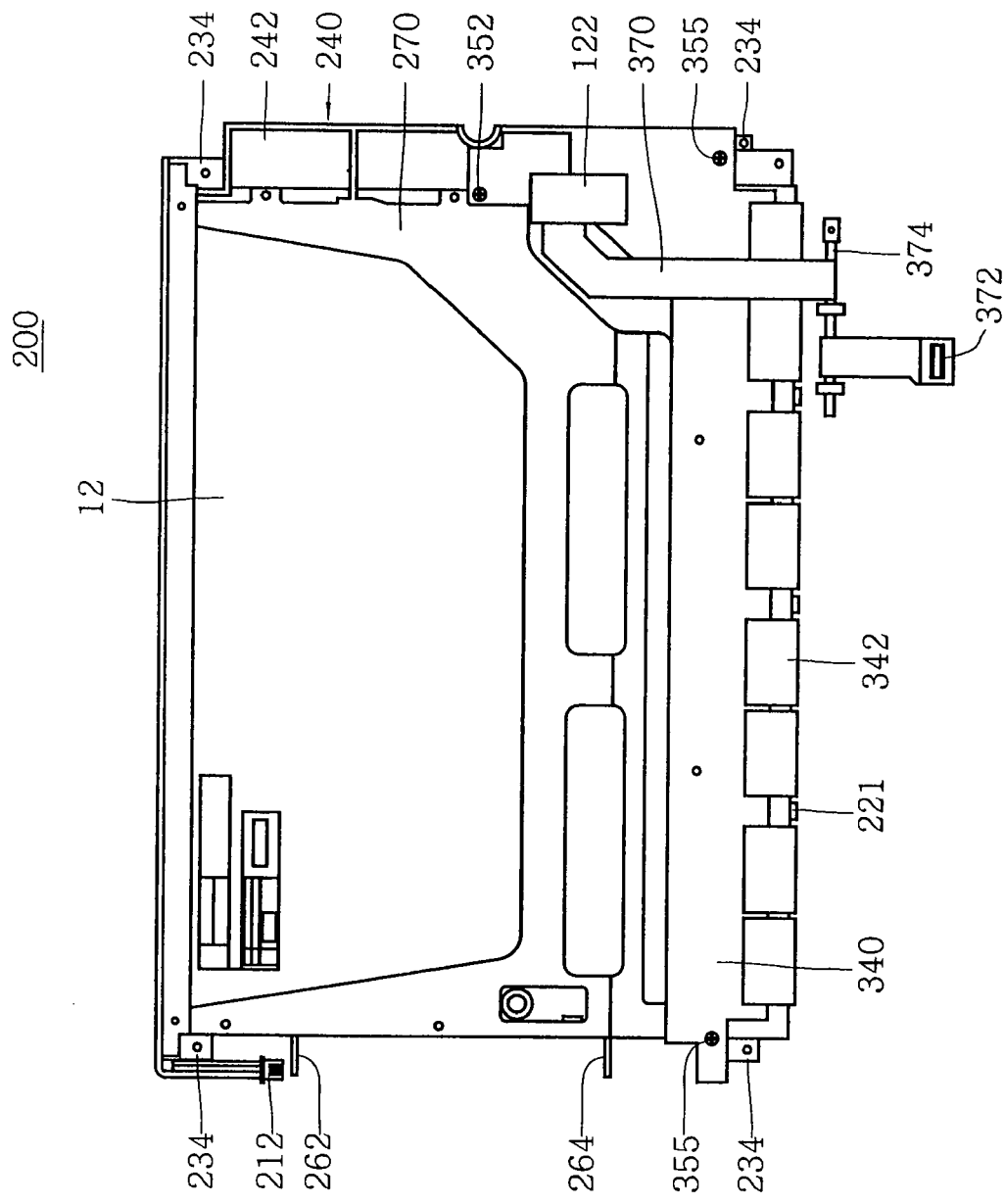
FIG. 12 is a rear elevation showing a source PCB mounted onto the rear surface of the mold frame according to the present invention.

FIG. 11 is an exploded perspective view showing a mold frame, a reflector plate, a light guide plate, and a series of sheets to be assembled as a backlight assembly according to the present invention.

Referring to FIG. 4A and FIG. 11, a lamp reflector plate 215 is accommodated into the lamp assembly receiving portion 210 formed integrally with the upper edge of the main receiving area 280. Then, the lamp spaced apart from the lamp reflector plate 215 is accommodated and fixed by a lamp holder (not shown). The lamp reflector plate 215 is exposed toward the rear surface of the mold frame 200, and grounded to the rear case 100. Wires 214 connected to both electrodes of the lamp are extended from the lamp assembly receiving portion 210, and connected to the lamp power supply male connector 212.

The reflector plate 10 is accommodated into the main receiving area 280 and contacts the supporting plate 270. Subsequently, the light guide plate 12, a diffusion sheet 14, and a pair of prism sheets 16 are sequentially deposited. Then, a cover sheet 18 is deposited thereon. A rubber pad 20 is used to seal the space between the cover sheet 18 and the mold frame 200.

The rubber pad 20 seals the accommodated sheets into the main receiving area 280, shielding light leakage between sheets and the mold frame 200.

Then, the LCD panel module 300 is assembled to the backlight assembly.

Referring to FIGS. 3, 4B, 6, 7 and 12, the LCD panel module 300 is mounted in such a manner that the lower panel 320 is accommodated into the region defined by protrusions 252 of the mold frame 200. Therefore, once installed within the region, the LCD panel module 300 may not move because protrusions 252 secures it.

Then, the source PCB 340 is rotated by 180 degrees toward the rear surface of the mold frame 200. At this time, TCPs 342 are accommodated, for example, in pairs, into the TCP receiving portion 220 formed at the lower edge of the mold frame 200. In addition, the driver IC 344 mounted to the rear surface of the TCP 342 is accommodated into the driving IC receiving groove 222 formed at the rear surface of the mold frame 200 when the TCP 342 is bent toward the rear surface of the mold frame 200. In this manner, the source PCB 340 can be fixed to the rear surface of the mold frame 200.

Some portions of the supporting plate 270 of the mold frame 200 corresponding to the source PCB 340 are eliminated, so that the source PCB 340 can be put together evenly with the supporting plate 270 when the source PCB 340 is fixed to the rear surface of the mold frame 200.

The female connector 346 and the male connector 336 are directly coupled by being pressed. Here, connectors 346, 336 are coupled by the window 242 of the gate PCB receiving portion 240.

Then, the source PCB 340 is fixed to the rear surface of the mold frame 200 via coupling holes 355, 352 formed at the source PCB 340. As described above, coupling holes 355 are electrically connected to the ground clip fixed to the tab 234 of the mold frame 200, which allows coupling holes 355 to ground the source PCB 340.

An end portion of the FPC 370 is inserted into the terminal block 376 of the source PCB 340, and the insulator tape 122 is provided so as to cover the terminal block 376.

FIG. 13 is an exploded perspective view showing an LCD panel module and a rear case before they are assembled, and an inverter before it is mounted to the mold frame according to the present invention.

Referring to FIG. 13, the mold frame 200 can be easily fixed by guide walls 110 when the LCD module is positioned to the rear case 100.

When the mold frame 200 is fixed, the mold frame 200 and the rear case 100 are aligned in such a manner that centers of tabs 234 and bosses 138 correspond. Thus, tabs 234 are fixed respectively to bosses 138 using screws 238.

At this time, the mold frame 200 and the rear case 100 may not fully coupled by fixing tabs 234 to bosses 138. But this may secure the mold frame 200 to the rear case 100 during the subsequent process.

Figure 8A:
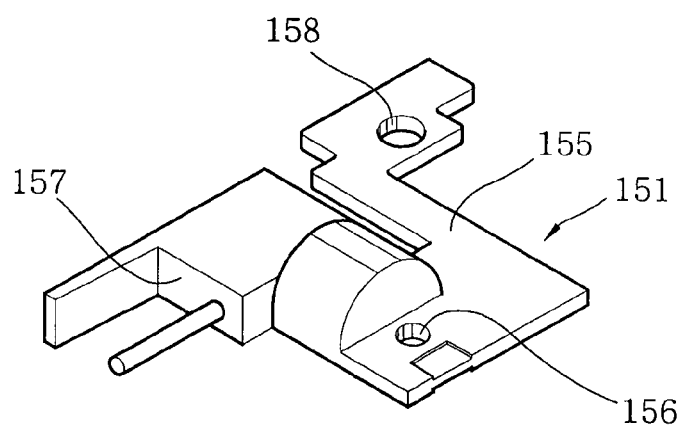
FIG. 8A is a perspective view showing a hinge according to the present invention.

The hinge 151 shown in FIG. 8A is mounted to the rear case 100. In more detail, the hinge 151 is fixed to the boss 138 of the rear case 100 by fixing a screw into the through hole 158 formed at the fixing portion 155 of the hinge 151. In addition, an end portion of the FPC holder 374 that holds the FPC 370, is fixed via the coupling groove 156.

Then, the inverter 600 is fixed to the mold frame 200 and the rear case 100. That is, the lamp power supply male connector 212 is inserted into the lamp power supply female connector 620, and protrusions 262a, 264a of supporting bars 262, 264 are inserted into insertion holes 640. If the guide groove 645 having a predetermined depth is formed at the corresponding position of supporting bars 262, 264, the inverter 600 can be fixed more stably to supporting bars 262, 264.

The male connector 660 formed at the inverter 600 is inserted into the female connector 360 exposed toward the rear surface of the mold frame 200. Then, the inverter 600 is fixed to the rear case 100 at the boss 136 by fixing a screw 652 via the coupling hole 650.

Figure 14:
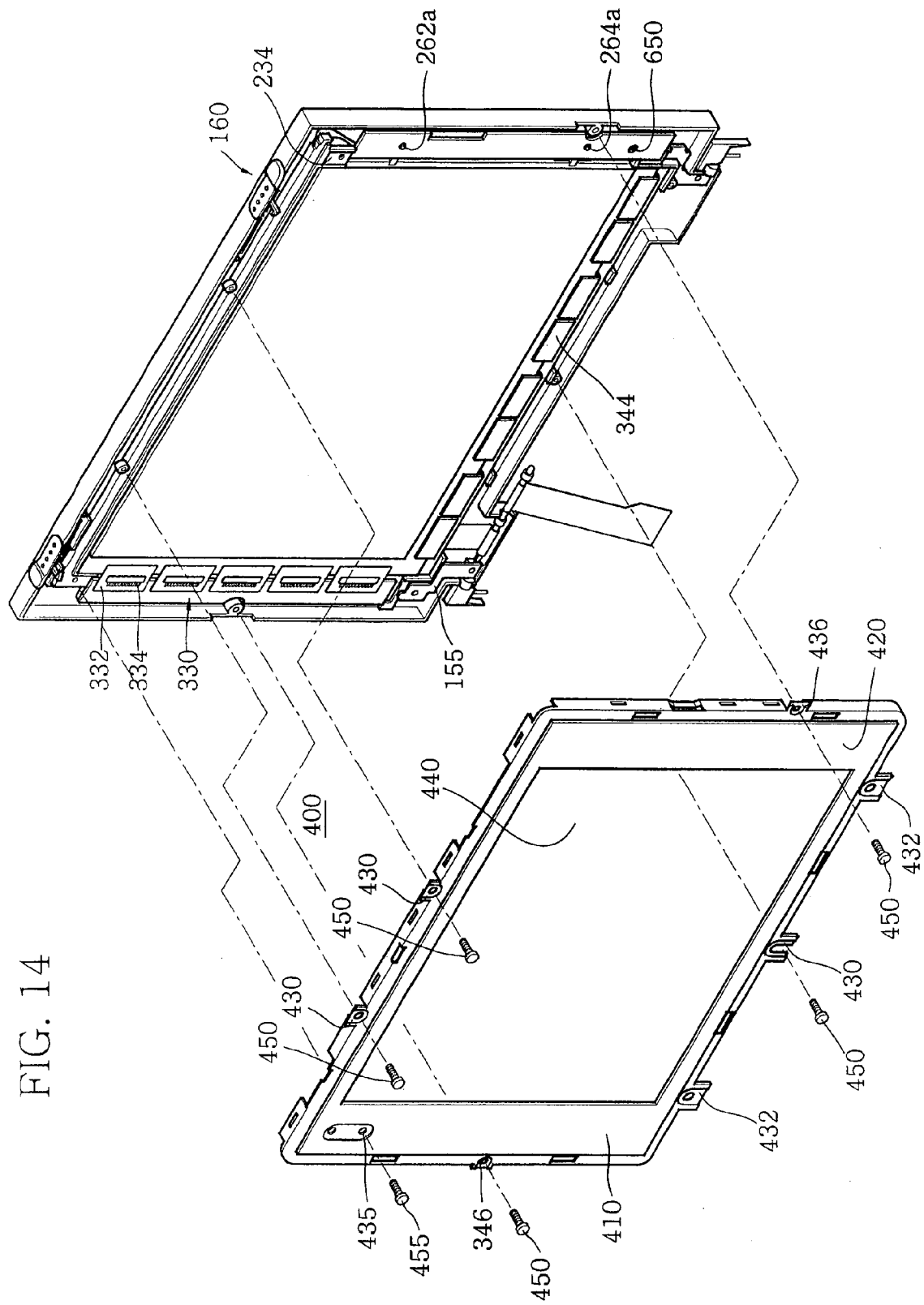
FIG. 14 is an exploded perspective view showing the main chassis for which the assembly process with reference to FIG. 13 is completed.

FIG. 14 is an exploded perspective view showing the main chassis 400 for which the assembly process with reference to FIG. 13 is completed.

Referring to FIG. 14, when the main chassis 400 is mounted to the front surface of the assembly explained with reference to FIG. 13, walls extended from the edges of the main chassis 400 reach the bottom surface of the rear case 100.

A plurality of screws 490 are directly fixed into bosses 130, 135 of the rear case 100 via a plurality of coupling holes 430 formed at the main chassis 400. The screw 455 is fixed into the boss 135 via the coupling hole 435 and the tab 235 of the mold frame 200.

As a final step, the front case 500 is coupled to the rear case 200.

Figure 15:
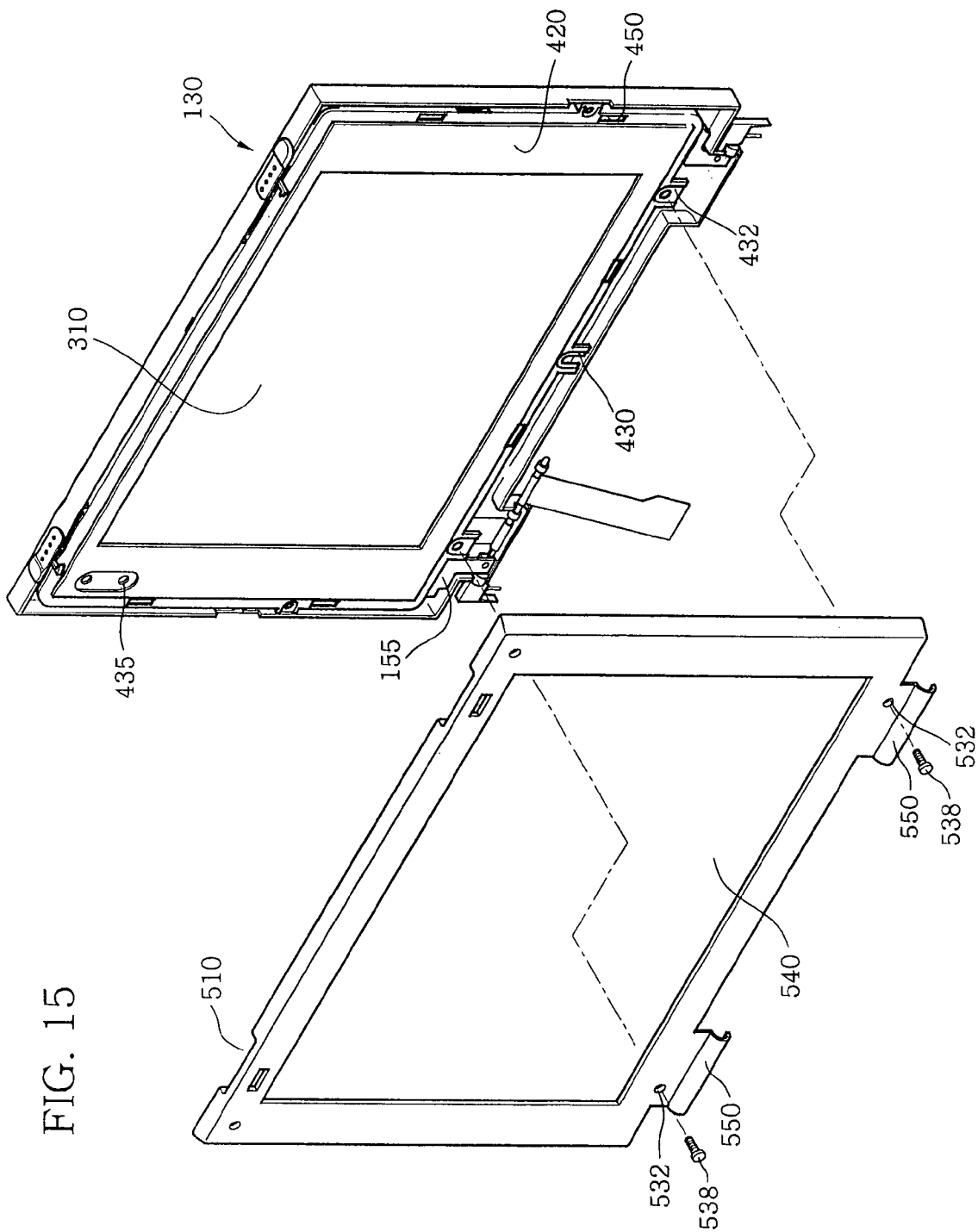
FIG. 15 is an exploded perspective view showing the front case for which the assembly process with reference to FIG. 14 is completed.

Referring to FIG. 15, when the front case 500 is mounted, protrusions 535 formed along the edge of the rear surface of the front case 500 as shown in FIG. 10 are inserted into the coupling holes 450 formed on sidewalls of the main chassis 400 shown in FIG. 9. Then, screws 538 are fixed to bosses 132 of the rear case 100 via the coupling hole 532 formed at the lower edge of the front case 500 and coupling holes 432 of the main chassis 400. At this time, locking portions 160 of the rear case 100 are inserted into the grooves 510 formed at the upper wall of the front case 500.

The display module of an LCD of the present invention is thus completed.

The present invention has some advantages as follows.

A predetermined conductive pattern is formed onto the source PCB in lieu of a conventional FPC for supplying an electric signal to an inverter, thereby simplifying the internal structure of the display module.

In addition, using the bent-type source PCB, the electric signal applied via the conductive pattern is applied by connecting board-to-board to the inverter and the source PCB. The source PCB and the gate PCB are electrically connected board-to-board, to thereby reduce an overall thickness. Moreover, the display module can be easily assembled, eliminating the need for connecting members like an additional FPC.

Such a board-to-board connection method is possible due to the structure of the source PCB bent and fixed to the rear surface of the mold frame. The present invention has a structure of a low positioned source PCB and a high positioned inverter and gate PCB when connected.

Meanwhile, the inverter supporting bar formed integrally with the mold frame is used for fixing the inverter, to thereby enhance assembly efficiency. The inverter can be more easily assembled by fixing the protrusion formed at the inverter supporting bar into the groove formed at the inverter.

The LCD module can be more firmly fixed to the rear case by the main chassis, which presents higher reliability in the shock and vibration test.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

What is claimed is:

1. A display device, comprising:
   a mold frame;
   an inverter attached on the mold frame and having a first connector;
   a display panel disposed on an upper surface of the mold frame;
   a printed circuit board (PCB) having a second connector at an end thereof;
   a flexible printed circuit (FPC) coupled between the display panel and the PCB,
   wherein the first connector and the second connector are engaged for electrically connecting the inverter and the printed circuit board by bending the FPC to attach the PCB on a lower surface of the mold frame.

2. The display device of claim 1, wherein:
   the flexible printed circuit (FPC) has a driver integrated circuit (IC) disposed thereon; and,
   the mold frame has a groove formed on a lower surface thereof in which the driver IC is received when the FPC is bent toward the lower surface of the mold frame.

3. The display device of claim 1, further comprising:
   a lamp unit received in the mold frame and having a lamp wire connected thereto; and,
   a fixing unit for fixing the lamp wire to the mold frame.

4. The display device of claim 3, wherein the mold frame comprises a lamp unit receiving portion integrally formed at an edge thereof for receiving the lamp unit.

5. The display device of claim 4, wherein the lamp wire fixing unit is integrally formed in the lamp unit receiving portion.

6. The display device of claim 5, wherein the lamp wire fixing unit comprises a plurality of fixing ribs.

7. The display device of claim 6, wherein the fixing ribs are formed alternately at opposite edges of an end portion of the lamp unit receiving portion.

* * * * *